US005254500A

United States Patent [19]

AuYeung

[11] Patent Number: 5,254,500
[45] Date of Patent: Oct. 19, 1993

[54] METHOD FOR MAKING AN INTEGRALLY MOLDED SEMICONDUCTOR DEVICE HEAT SINK

[75] Inventor: David S. AuYeung, Austin, Tex.

[73] Assignee: Advanced Micro Devices, Inc., Sunnyvale, Calif.

[21] Appl. No.: 908,987

[22] Filed: Jul. 6, 1992

Related U.S. Application Data

[62] Division of Ser. No. 650,626, Feb. 5, 1991, Pat. No. 5,155,579.

[51] Int. Cl.$^5$ ............... H01L 21/56; H01L 21/58; H01L 21/60
[52] U.S. Cl. ................... 437/214; 437/220; 437/902
[58] Field of Search .......... 257/707; 437/214, 220, 437/902; 174/16, 3; 439/487

[56] References Cited

U.S. PATENT DOCUMENTS 5,057,903 10/1991 Olla ........................... 257/788
5,108,955 4/1992 Ishida et al. ................. 437/902
5,147,821 9/1992 McShane et al. ............. 437/902
5,179,039 1/1993 Ishida et al. ................. 437/902

*Primary Examiner*—Olik Chaudhuri
*Assistant Examiner*—David E. Graybill
*Attorney, Agent, or Firm*—Johnson & Gibbs

[57] ABSTRACT

A method of making a molded heat sink for plastic packages constructed for housing semi-conductor devices. Heat is removed from the semiconductor device by direct heat transfer from the device through upstanding members integrally molded in the top of the plastic housing. The integrally molded heat dissipation members facilitate cooling of the semi-conductor die which is not available by normal dissipation by convection and radiation through a generally planar external surface of the package. The molded members permit effective heat dissipation without the thermal coefficient of expansion mismatch which may occur between conventional molded packages and heat sinks secured thereto.

8 Claims, 1 Drawing Sheet

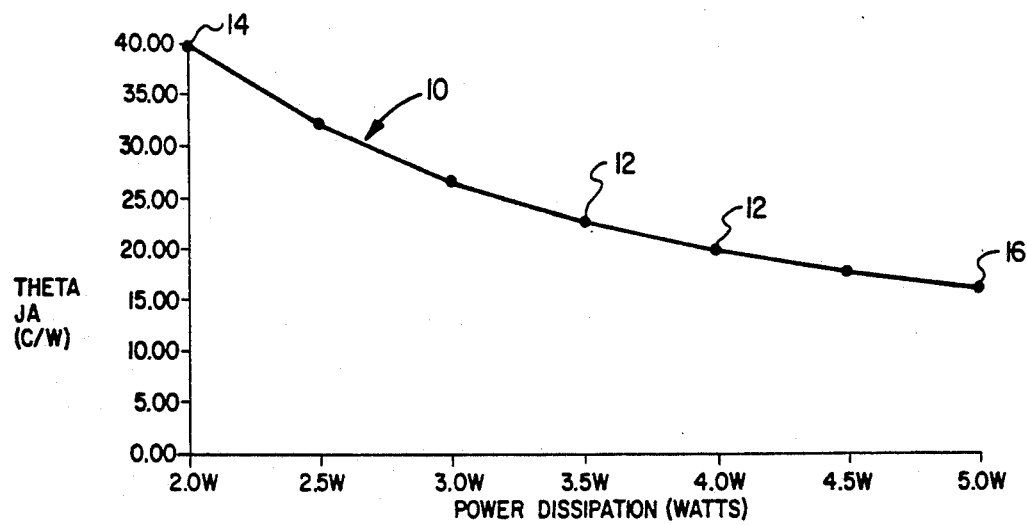
FIG. 1
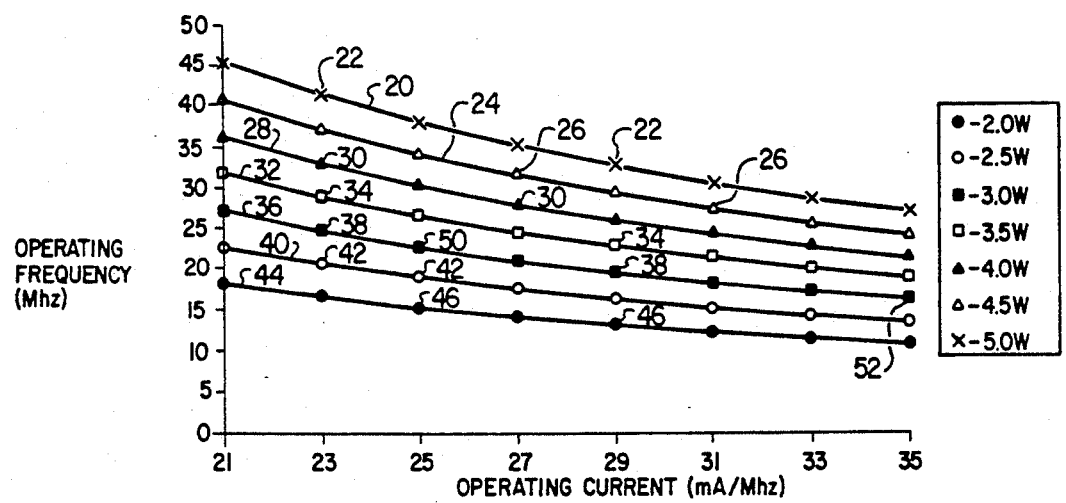
FIG. 2
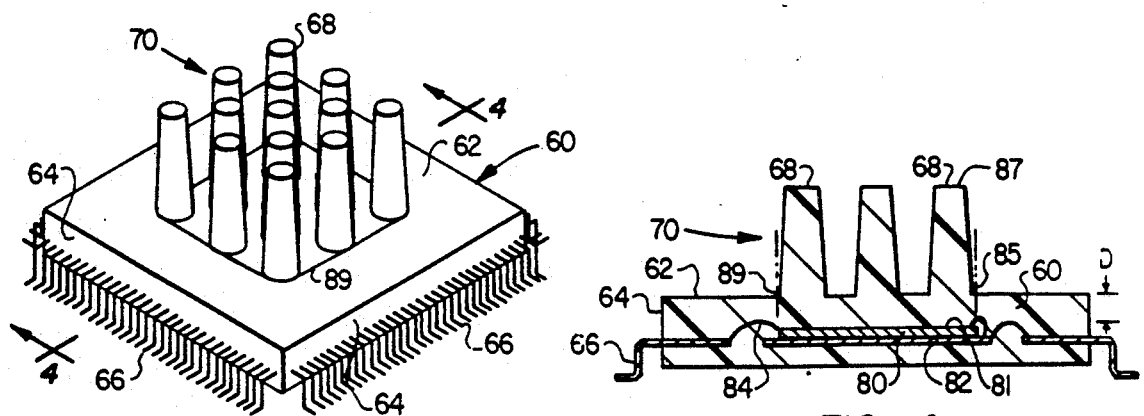
FIG. 3
FIG. 4

METHOD FOR MAKING AN INTEGRALLY MOLDED SEMICONDUCTOR DEVICE HEAT SINK

This is a division of application Ser. No. 07/650,626, filed Feb. 5, 1991. Now U.S. Pat. No. 5,155,579.

BACKGROUND OF THE INVENTION

1. Field of the Invention

The present invention relates to integrated circuit packages and, more particularly, to an integrated circuit package having a heat sink integrally molded therein for direct dissipation of heat from a semi-conductor device.

2. History of the Prior Art

In the electronic industry, it is conventional to encapsulate semi-conductor devices such as integrated circuit chips in molded packages. Such packages protect the chip from the environment and provide means for mechanically and electrically mounting the chip for operative electrical interconnection to a circuit. Each chip comprises a number of functional components and the total number of components on a semi-conductor device, known as an integrated (or "IC") circuit, has increased significantly with advances in semiconductor fabrication technology. One such advance has been the ability to reduce the physical size of the various elements of the integrated circuit chip. When this improvement is combined with the ability to increase the overall integrated circuit chip size, a number of associated problems have surfaced. For example, an increase in the number of integrated circuit elements in a chip of a given size means an increase in the electrical energy moving through the components of the chips and an increase in the heat generated by that energy. Heat dissipation from IC chips has thus become a significant consideration in electronic circuit design. As individual components, the power consumption of small electronic elements is relatively small, and the heat generated is relatively insignificant. However, as the number of integrated circuit elements located on a chip of a given size increases, the elements become more densely packed and heat generation and dissipation becomes an issue. There has also been a recent tendency toward incorporating components having higher power ratings into semi-conductor devices. These factors taken collectively have resulted in heat dissipation and thermal management becoming significant concerns in semiconductor package design.

Select temperature ranges are required in the design and operation of semi-conductor devices. Intense heat can cause serious degradation of portions of a semiconductor and an increase in the failure rate of such devices. For example, operational temperatures of 100°-125° centigrade are generally acceptable in the semi-conductor industry, and specific design features have thus been incorporated into various semi-conductor devices in an effort to dissipate heat therefrom and maintain an operating temperature generally within the range.

The most conventional technique of heat dissipation in the electronic industry is the use of a heat sink. Such devices have been used for decades in basic thermal management of large electronic devices, such as dimmer switches. With the inherent complexity of small, sophisticated semi-conductor devices and integrated circuit packages, there comes the need for more sophisticated heat sink designs and heat dissipation systems. One such system is set forth and shown in U.S. Pat. No. 4,888,449 to Crane et al. The Crane et al. patent teaches improvements in semi-conductor packages for electrical components which includes a base member having an expanded surface area, such as grooves, to provide an additional area for heat transfer. Such designs are said to be useful in dual in-line packages (DIP) as well as plastic quad flat pack (PQFP) applications.

Another prior art approach is seen in U.S. Pat. No. 4,887,149, to Romano in which a package for semi-conductor devices having a metal base plate heat sink is shown. The metal base is mounted to a suitable external heat sink designed to accommodate the necessary heat dissipation. Such approaches are often necessary because the plastic packages which actually house the chips are generally poor heat conductors. Semi-conductor packages may be produced in a number of configurations, such as plastic dual in-line packages ("DIP") and plastic quad flat packs ("PQFP"). There are also other forms of discrete semi-conductor devices for which different acronyms apply. In the main, these different devices are integrated circuit chips secured within plastic packages molded from thermoset resins with a connection lead frame also molded therein.

The manufacture of a semi-conductor device requires a high degree of cleanliness and sterility both in the manufacturing environment and in its ultimate environment within the plastic package. The ability of a semi-conductor device to perform satisfactorily from both an electrical and a mechanical standpoint depends on the nature and quality of the materials forming the various layers of the device and their assembly within the package. For a semi-conductor to operate properly, the chemical composition of these materials must be extremely pure and remain in that state. This requires that the semi-conductor device, often known as a "die", remain hermetically sealed from foreign matter and, in particular, moisture. Because the die is supported within the plastic package by a metal lead frame, problems arise from the mechanical properties of the different materials. For example, the plastic to metal bond between the lead frame and the plastic package can deteriorate. When this happens, the die can be exposed to moisture and other contaminants from outside the package. In certain instances problems can even arise by diffusion of contaminants through the plastic package itself or from the gradual chemical degradation of the package. In this respect, the heat generated during operation of the semi-conductor device can further exacerbate the corrosive action which may occur in the package as well as produce thermal stresses within the package and further compromise its hermetic seal. For example, the differential in the coefficient of thermal expansion between the metal lead frame and the thermoset plastic resin package can be significant. With the generation of sufficient heat by the semi-conductor device to produce an operating temperature on the order of a 100° centigrade, the thermal expansion incompatibility problem itself can create serious reliability issues. Although much of the heat may be transferred through the lead frame to the outside of the package, a significant portion of the heat is maintained in the package and must be dissipated directly from it. For this reason, use of heat sinks both above and below a semi-conductor package has found widespread acceptance and has been the subject of considerable design attention.

U.S. Pat. No. 4,092,697 to Spaight addresses a heat transfer mechanism for an integrated circuit chip. In the Spaight patent, heat is removed from the integrated circuit chip by means of a thermal liquid material contained in a film mounted on the underside of a cover enclosing a plurality of chips. The cover is formed as a heat radiator and thus includes a cross-grooved surface forming an enlarged surface area. The thermal liquid material creates a thermal path for directly conducting heat from the die to the heat radiator as compared to conventional packages where only thermally insulative inert gas is disposed around the die. The inert gas presents a significant thermal resistance that severely limits the power dissipation of the package.

It is well known to utilize separate heat sinks that are secured directly to the semi-conductor device. Various thermally conductive bonding agents may be used to attach a heat sink, and other systems may be incorporated with the heat sink to assist in heat dissipation. However, one of the primary problems in cooling an IC package is the thickness of the package itself. The molding material for plastic packages is generally a very poor thermal conductor, and while the use of a thermal film may improve performance with regard to heat transfer between the die and the package, the thickness of the package alone significantly reduces the heat transfer efficiency. In order to reduce the thickness of the overall package, it would be a distinct advantage to reduce the thickness of the portion of the plastic package material between the die and the heat sink for maximizing the heat dissipation effect thereof. The present invention addresses this problem by minimizing the distance between the die and a set of heat sink fins by integrally molding a concentrated array of heat sink fins immediately over the die in the body of the plastic package. This reduces the distance which the heat must travel to reach the fins and concentrates the heat dissipation structure within the area in which it is most critical, thereby increasing the overall reliability of the heat transfer.

It would be an advantage, therefore, to provide a semi-conductor package such as a PQFP in a configuration affording improved heat dissipation to meet the ever increasing speed and power requirements for such semi-conductor devices. Although plastic heat sinks have been disposed atop PQFP packages, the mismatch of thermal expansion coefficients between the interfacing materials has generated a number of structural incompatibility problems which are overcome by the present invention. In the present invention, a molded fin heat sink structure is integrally molded in the plastic package itself for direct dissipation of heat immediately above the die housed within the package.

SUMMARY OF THE INVENTION

The present invention relates to an improved method of and apparatus for dissipating heat in semi-conductor packages. More particularly, one aspect of the invention includes an integrated circuit package integrally formed with a centrally disposed heat sink along the top surface thereof for dissipating heat directly from the IC chip housed therein. In one particular aspect of the invention, the heat dissipation elements comprise conical protuberances affording rapid heat dissipation and thermal stress stability.

In another aspect, the invention includes an improved semi-conductor package of the type wherein a semi-conductor device is housed within a plastic package for operation therein, and an integrally molded heat dissipation array is disposed immediately above the semi-conductor device. The array comprises a plurality of upstanding heat dissipation members. In one particular embodiment, each of the heat dissipation members comprise an array of at least ten conical members integrally molded with the package.

In a further aspect, the invention includes an improved method of packaging an integrated circuit device in a housing having wires of a lead frame extending outwardly therefrom for electrical contact with a circuit. The method comprises the steps of securing the semi-conductor device upon a lead frame, molding the lead frame and semi-conductor device within a thermoset plastic housing, and integrally molding a plurality of upstanding heat dissipation elements immediately above the semi-conductor device for dissipating heat generated thereby.

BRIEF DESCRIPTION OF THE DRAWINGS

For a brief understanding of the present invention and for further objects and advantages thereof, reference may now be had to the following description taken in conjunction with the accompanying drawings, in which:

FIG. 1 is a performance graph charting thermal resistance values as a function of power dissipation of an integrated circuit package;

FIG. 2 is a performance graph charting operating frequency at different power consumption levels for various operating currents of an integrated circuit package;

FIG. 3 is a perspective view of an integrated circuit package constructed in accordance with the principles of the present invention and illustrating a heat sink array integrally formed on the top portion thereof; and FIG. 4 is a side elevational cross sectional view of the integrated circuit package of FIG. 3 taken along lines 4—4 thereof.

DESCRIPTION OF THE PREFERRED EMBODIMENT

Referring first to FIG. 1, there is shown for a conventional semi-conductor package the thermal resistance values as a function of power dissipation at a maximum junction temperature of 125° centigrade and an ambient temperature of 45° centigrade. It is recognized in the semi-conductor manufacturing industry that the junction to ambient resistance (Theta-Ja) value for a plastic quad flat pack (PQFP) is about 40° centigrade per watt (c/w). Such a package should thus not be used for devices consuming more than two watts, because the junction temperature limit would otherwise be exceeded. The curve of FIG. 1 illustrates that as the Theta-Ja values are reduced, the power dissipation in watts may be increased. This is an important guideline, because conventionally recognized reliability issues, such as mobile ion contamination and intermetallic formation on bond pads, are exacerbated by higher die operating temperatures. It may thus be seen from the curve of FIG. 1 that a device consuming about three watts should have a Theta-Ja value around 26 c/w in order to avoid thermal related reliability problems.

Referring still to FIG. 1, the curve 10 includes a plurality of points 12 indicating the Theta-Ja values for increasing power dissipation. Point 14 illustrates that with a Theta-Ja value at approximately 40 c/w, the maximum power dissipation is about two watts, while at point 16 the Theta-Ja value is approximately 20 c/w for a power consumption of five watts. For an increase of 150% from two watts to five watts the Theta-Ja value is thus reduced by 50%. This information is critical in the analysis of the maximum speed allowed for a particular semi-conductor device at a given operating current.

Referring now to FIG. 2, there is shown for a conventional semi-conductor package system clock frequency at different power consumption levels for a junction temperature below 125° centigrade. The purpose of this graph is to illustrate the need to increase power dissipation which permits an increase in operating frequency. At the same time Theta-Ja should be reduced to avoid exceeding the junction temperature limit. It may be seen that the higher the operating frequency, the higher the power consumption for a given operating current under these conditions. Actual average current of a test semi-conductor device has been measured at 25 mA/MHz when dissipating 3.0 watts of power with a junction temperature below 125° centigrade. The maximum operating frequency under these boundary conditions can be seen from the curve of FIG. 2 to be around 23 MHz. Unless the current can be reduced by some other means, existing package designs would thus not be suitable for high performance applications. For example, if a semi-conductor device utilizes the same PQFP package at a higher current of say 35 ma/MHz, the maximum speed allowed for the device would be around 17 MHz. It is for this reason that the present invention provides a method of and apparatus for dissipating heat from such semi-conductor devices which allows them to operate at higher frequency values.

It is well recognized that most molding material used for plastic packages for semi-conductor devices is generally a very poor thermal conductor. When heat generated by the die cannot be released to the ambient air efficiently, die junction temperature will rise to levels where reliability of the parts is seriously compromised. Junction temperatures are generally rated no higher than 150° centigrade for reliability purposes.

Referring still to FIG. 2, the graph comprises a series of curves indicative of various power consumption levels. Top line 20 contains a series of points 22 indicating the power consumption at five watts. Line 24 includes a plurality of points 26 indicative of power consumption at 4.5 watts. Line 28 includes a plurality of points 30 indicating power consumption at 4.0 watts. Line 32 is made up of a plurality of points 34 indicating power consumption at 3.5 watts. Line 36 is comprised of a plurality of points 38 indicating power consumption at 3.0 watts. Line 40 is made up of a plurality of points 42 indicating power consumption at 2.5 watts. Finally, line 44 is comprised of a plurality of points 46 indicating power consumption at 2.0 watts. Each of the lines 22, 24, 28, 32, 36, 40 and 44 have substantially the same general curvature, wherein operating frequency decreases for an increase in operating current. Likewise, an increase in frequency for a given operating current results in an increase in power consumption. More specifically, a semi-conductor device operating at 25 mA/MHz and dissipating 3.0 watts at a junction temperature below 125° Centigrade is indicated by point 50 of curve 36. It may be seen that the maximum frequency under the boundary conditions is on the order of 23 MHz. Unless the current can be reduced by some other means, a semi-conductor device which must operate at 35 mA/MHz will have a maximum speed of about 17 MHz as represented by point 52 of curve 36.

Referring now to FIG. 3, there is shown a semi-conductor package 60 of the PQFP variety which is constructed in accordance with the teachings of the present invention. The package includes a top surface 62 and four sides 64 therearound. Extending from sides 64 are a plurality of lead wires 66 adapted for electrical interconnection with a circuit board or the like. Upstanding from top surface 62 are a plurality of conical members 68 (at least 10 in this embodiment) constructed for the dissipation of heat from the package 60. The conical members 68 are provided in a concentrated array 70, which array is generally centrally disposed about the top portion 62 and placed in a position immediately above the semi-conductor device (not shown in this view). The heat dissipation from array 70 is important to improving the performance of semi-conductor devices having higher power consumption and/or operating frequency requirements. In accordance therewith, it may be seen that the heat dissipation array 70 is integrally formed in the package 60 immediately above, and in intimate contact with the semi-conductor device housed therein as further described below.

Referring now to FIG. 4, the array 70 of heat dissipation members 68 is disposed immediately above semi-conductor device, or IC chip 80. Chip 80, having a top surface 81 is disposed upon a lead frame 82 from which lead wires 66 extend outwardly of sides 64 of the package 60. A series of coupling wires 84 electrically connect the die 80 to the wires 66 of the lead frame 82. Heat generated by the semi-conductor device 80 is then permitted to pass through the molded plastic of the package 60 directly into and through the heat dissipation members 68 upstanding therefrom. The base 85 of each member 68 is in direct molded contact with the top surface 81 of the chip 80, which integral molding assures the assembly of efficient heat transfer from said chip to said heat dissipation members. Moreover, the array 70 has an outer perimeter 89 which is substantially disposed in axial alignment with the outside edges of chip 80, as shown herein. The distance D from the top surface 81 of the chip 80 to the top surface 62 of the package 60 where base 85 of the heat dissipation members 68 is first exposed is as short as possible and less than the distance from lead frame 82 to top surface 62.

Still referring to FIG. 4, a design of 13 pins has been shown in this cross sectional configuration view in conjunction with FIG. 3. Although the shape of each heat dissipation member 68 may vary, the present embodiment illustrates a desirable increase in surface area while accommodating the potentially deleterious effects of thermal differentials. With the intense heat given off by the die 80, the thermal differential between the exposed base regions 85 and upper region 87 of the dissipation member 68 can be substantial. For this reason, the exposed base section 85 is preferably wider relative to the top portion 87. This design feature provides for an increase in area for both absorbing heat directly from the die 80 as well as improving the structural characteristics relative thereto. Unlike various prior art configurations, the integral formation of the member 68 and the package 60 eliminates any possibility of a mismatch between the coefficient of thermal expansion in the element 68 and the remaining portion of the package 60. The elimination of such incompatibility problems further reduces the chances of stress fractures and warpage of the package 60 of the type which can occur with high power dissipation requirements.

Referring now to FIGS. 1 and 4 in combination, it may be seen that the increase in heat transfer surface area will contribute to lowering of the junction temperature in the package 60. The analysis of this heat dissipation may be seen by the following formula wherein the convection rate equation ($Q_c$) of a heat sink gives:

$$Q_c = hpdx (T_a - T_b); \quad (1)$$

where, $pd$ - represents surface area for convection heat transfer;

$h$ - represents convection coefficient of the material; and $T_a - T_b$ - represents the temperature gradient between the fin and the surrounding air.

Formula (1) illustrates that the convection rate is directly proportional to convection heat transfer area. It is assumed, for this purpose, that heat generated by the die is dissipated in an area about the size of the die. Therefore, a die 80 in a PQFP having an area of 196K sq. mil will have only that area for transferring heat to the ambient. The design in FIG. 3 has thirteen pin fins and each pin fin has a radius of 45 mil. The total area increased is calculated as follows:

Area increased per pin fin as a function of height (h):

$$2 \times 3.1416 \times 45 \text{ mil} \times h = 282.7 \text{ mil} \times h;$$

where, h = height of pin fin for 13 pin fins on the package:

For various exemplary values of h the following results are produced:

| Pin Fin Height | Total Area Increased | Increase Over Std POFP Pkg. |
| --- | --- | --- |
| h = 100 mil | 367.6K sq mil | 1.9× |
| h = 200 mil | 735.1K sq mil | 3.8× |
| h = 300 mil | 1102.7K sq mil | 5.6× |

The following table shows what percentage of improvement is required to bring junction temperature to within the requirement for two different illustrative levels of power consumption:

| % of Theta-Ja Reduction | Theta-Ja Value | Junction Temp. (−3 w & 45 c.) | Junction Temp. (02.5 w & 45 c.) |
| --- | --- | --- | --- |
| 0% | 40.00 c/w | 165.00 c. | 145.00 c. |
| 5% | 38.00 c/w | 159.00 c. | 140.00 c. |
| 10% | 36.00 c/w | 153.00 c. | 135.00 c. |
| 15% | 34.00 c/w | 147.00 c. | 130.00 c. |
| 20% | 32.00 c/w | 141.00 c. | 125.00 c. |
| 25% | 30.00 c/w | 135.00 c. | 120.00 c. |
| 30% | 28.00 c/w | 129.00 c. | 115.00 c. |
| 35% | 26.00 c/w | 123.00 c. | 110.00 c. |
| 40% | 24.00 c/w | 117.00 c. | 105.00 c. |
| 45% | 22.00 c/w | 111.00 c. | 100.00 c. |

This data indicates that one must achieve a thermal resistance value of less than 26 c/w for a three watt device to meet the 125° C. requirement.

In summary, the advantages of using the package 60 of the present invention having a molded array 70 of heat dissipation element 68 are multifold. The above described method and apparatus eliminates the additional cost of a separate heat sink and the cost of its attachment. The thermal conduction flow path between the semi-conductor device 80 and the surface for heat dissipation is substantially shorter because the base of an external heat sink is often on the order 100 mil thick. With the present invention, there is no additional labor cost for the heat sink and no additional quality control considerations. More importantly, the present design eliminates the potential for a thermal coefficient of expansion mismatch between a separate heat sink and the housing that can cause stress related fractures, opening and warpage thereof. Such a package also produces a lighter overall weight.

In operation, the plastic quad flat pack package (PQFP) 60 of the present invention is integrally molded with the heat dissipation member 68 upstanding from the top surface 62 thereof. A variety of shapes of the heat dissipation element 68 may, of course, be utilized in accordance with the principles of the present invention. However, by integrally molding said upstanding elements 68 immediately above the die 80 and in a centrally disposed, closely proximate location thereto, the problem of the prior art in bonding heat sinks to the surface of the package 60 and/or thermal conduction therethrough may be eliminated.

It is thus believed that the operation and construction of the present invention will be apparent from the foregoing description. While the method and apparatus shown and described has been characterized as being preferred, it will be obvious that various changes and modifications may be made therein without departing from the spirit and the scope of the invention as defined in the following claims.

What is claimed is:

1. A method of cooling a semi-conductor device housed within a discrete package, said method comprising said steps of:

integrally molding a plurality of heat dissipation elements immediately above said semi-conductor device in molded engagement therewith and upstanding therefrom and dissipating heat generated thereby securing said semi-conductor device in direct thermal contact with said heat dissipation elements to thereby transfer heat from said semi-conductor device through said heat dissipation elements and outwardly therefrom; and discharging heat from said semi-conductor device through said heat dissipation elements.

2. The method as set forth in claim 1 and including the step of forming said heat dissipation elements in a conical configuration integrally formed in said package.

3. An improved method of packaging device of the type having outside edges and being encapsulated in a housing having wires of a lead frame extending outwardly therefrom for electrical contact with other semi-conductor devices, said improvement comprising the steps of:

securing said semi-conductor device upon a lead frame;

molding a plastic housing around said lead frame and semi-conductor device; and integrally molding a plurality of heat dissipation elements immediately above said semi-conductor device in molded engagement therewith; upstanding therefrom and dissipating heat generated thereby.

4. The method as set forth in claim 3 and including the step of moding each of said heat dissipation members in a conical configuration.

5. The method as set forth in claim 4 and including the step of forming at least 10 conical members above said semi-conductor device and said members disposed in a generally rectangular array immediately above said semi-conductor device housed therebeneath.

6. The method as set forth in claim 3 wherein said packaged semi-conductor device is a plastic quad flat pack.

7. The method as set forth in claim 3 and including the step of integrally molding said heat dissipation elements from a thermoset plastic.

8. The method as set forth in claim 3 and including the step of molding said housing with the top of the semi-conductor device at a distance relative to the base of said heat dissipation members less than the distance from the top of said housing to the top of said lead frame disposed therein.

* * * * *